United States Patent
An et al.

(10) Patent No.: US 11,205,464 B2
(45) Date of Patent: Dec. 21, 2021

(54) SEMICONDUCTOR APPARATUS AND A SEMICONDUCTOR SYSTEM CAPABLE OF ADJUSTING TIMINGS OF DATA AND DATA STROBE SIGNAL

(71) Applicant: SK hynix Inc., Icheon-si (KR)

(72) Inventors: Soon Sung An, Icheon-si (KR); Kwan Su Shon, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/911,227

(22) Filed: Jun. 24, 2020

(65) Prior Publication Data

US 2021/0201968 A1 Jul. 1, 2021

(30) Foreign Application Priority Data

Dec. 26, 2019 (KR) .......................... 10-2019-0175054

(51) Int. Cl.
| | |
|---|---|
| *G11C 8/00* | (2006.01) |
| *G11C 7/22* | (2006.01) |
| *G11C 7/10* | (2006.01) |
| *H03K 17/284* | (2006.01) |
| *G11C 11/4074* | (2006.01) |

(52) U.S. Cl.
CPC ............ *G11C 7/222* (2013.01); *G11C 7/1057* (2013.01); *G11C 7/1084* (2013.01); *G11C 11/4074* (2013.01); *H03K 17/284* (2013.01)

(58) Field of Classification Search
CPC ...... G11C 7/222; G11C 7/1057; G11C 7/1084; G11C 11/4074; H03K 17/284
USPC ........................................................ 365/230.1
See application file for complete search history.

(56) References Cited

U.S. PATENT DOCUMENTS

2008/0130377 A1* 6/2008 Chen .................... G11C 7/1093
365/189.07

FOREIGN PATENT DOCUMENTS

| KR | 1020140041207 A | 4/2014 |
|---|---|---|
| KR | 1020140124202 A | 10/2014 |

* cited by examiner

*Primary Examiner* — Huan Hoang
(74) *Attorney, Agent, or Firm* — William Park & Associates Ltd.

(57) ABSTRACT

A semiconductor apparatus includes a first receiver, a second receiver, a first delay line, and a second delay line. The first receiver receives an input signal using a first supply voltage. The first delay line delays an output of the first receiver based on a first delay control signal and a first complementary delay control signal to generate a received signal. The second receiver receives a clock signal using a second supply voltage. The second delay line delays an output of the second receiver based on a second delay control signal and a second complementary delay control signal to generate a received clock signal. Delay amounts of the first and second delay lines are complementarily changed based on the first and second supply voltages.

18 Claims, 4 Drawing Sheets

SEMICONDUCTOR APPARATUS AND A SEMICONDUCTOR SYSTEM CAPABLE OF ADJUSTING TIMINGS OF DATA AND DATA STROBE SIGNAL

CROSS-REFERENCES TO RELATED APPLICATION

The present application claims priority under 35 U.S.C. § 119(a) to Korean application number 10-2019-0175054, filed on Dec. 26, 2019, in the Korean Intellectual Property Office, which is incorporated herein by reference in its entirety.

BACKGROUND

1. Technical Field

Various embodiments generally relate to integrated circuit technology, and more particularly, to a semiconductor apparatus and a semiconductor system which can operate in synchronization with a clock signal.

2. Related Art

An electronic device may include many electronic components. A computer system, for example, may include a large number of semiconductor apparatuses composed of semiconductors. The semiconductor apparatuses constituting the computer system may communicate with each other while transmitting and receiving clocks and data. The semiconductor apparatuses may operate in synchronization with a clock signal. The semiconductor apparatuses may transmit and/or receive data and a data strobe signal in order to perform data communication with other semiconductor apparatuses. The data strobe signal may be a clock signal which toggles in synchronization with timing at which the data is transmitted. Therefore, it is important to match the timings of the data and the data strobe signals such that the semiconductor apparatuses accurately transmit and/or receive data. However, a skew may occur between the timings of the data and the data strobe signal due to various internal factors of the semiconductor apparatuses.

SUMMARY

In an embodiment, a semiconductor apparatus may include a first receiver, a first delay line, a second receiver, a second delay line, a first voltage detection circuit, and a second voltage detection circuit. The first receiver may configured to receive an input signal is using a first supply voltage. The first delay line may be configured to delay an output of the first receiver, based on a first delay control signal and a first complementary delay control signal, to generate a received signal. The second receiver may be configured to receive a clock signal using a second supply voltage. The second delay line may be configured to delay an output of the second receiver, based on a second delay control signal and a second complementary delay control signal, to generate a received clock signal. The first voltage detection circuit may be configured to receive the first supply voltage as a positive input signal, to receive the second supply voltage as a negative input signal, and to compare the levels of the first and second supply voltages to generate the first delay control signal and the first complementary delay control signal. The second voltage detection circuit may be configured to receive the second supply voltage as a positive input signal, to receive the first supply voltage as a negative input signal, and to compare the levels of the first and second supply voltages to generate the second delay control signal and the second complementary delay control signal.

In an embodiment, a semiconductor apparatus may include a data receiver, a first delay line, a strobe receiver, and a second delay line. The data receiver may be configured to receive a first supply voltage from a first power supply line and to receive a data signal. The first delay line may be configured to variably delay the received data signal to generate a delayed data signal. The strobe receiver may be configured to receive a second supply voltage from a second power supply line and to receive a data strobe signal. The second delay line may be configured to variably delay the received data strobe signal to generate a delayed data strobe signal. A delay amount of the first delay line is changed complementarily with a delay amount of the second delay line, based on the first and second supply voltages.

DETAILED DESCRIPTION

Figure 1:
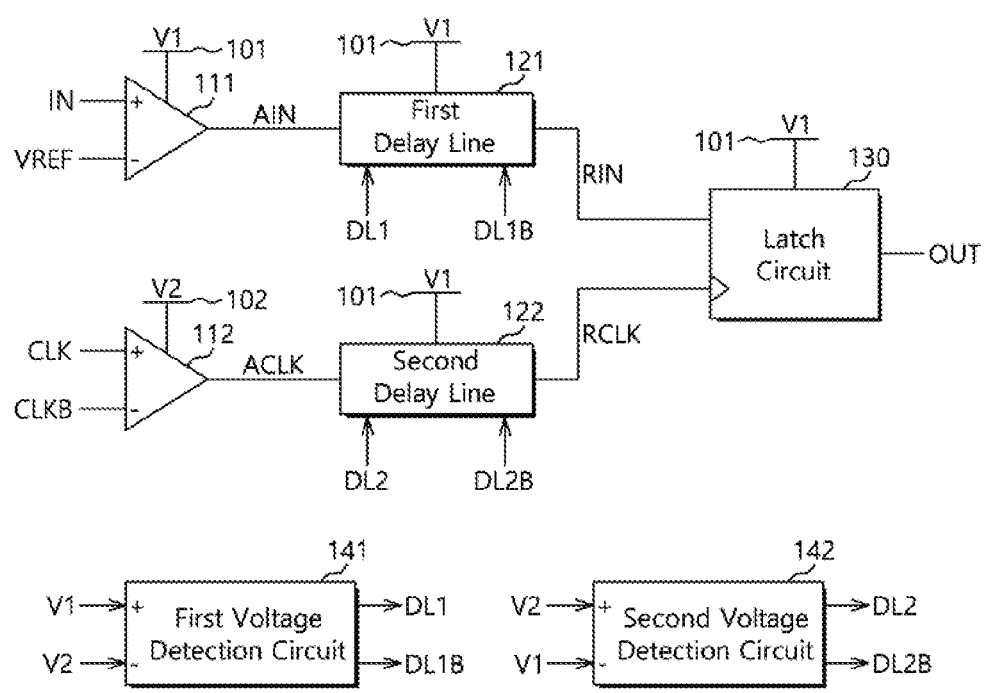
FIG. 1 is a diagram illustrating a configuration of a semiconductor apparatus in accordance with an embodiment.

FIG. 1 is a diagram illustrating a configuration of a semiconductor apparatus 100 in accordance with an embodiment. Referring to FIG. 1, the semiconductor apparatus 100 may receive an input signal IN and a clock signal CLK, and generate an output signal OUT based on the input signal IN and the clock signal CLK. The semiconductor apparatus 100 may delay the input signal IN and the clock signal CLK, and generate the output signal OUT by synchronizing the delayed input signal with the delayed clock signal. The semiconductor apparatus 100 may receive the input signal IN and the clock signal CLK through different paths, using different supply voltages. The input signal IN may be received in synchronization with the clock signal CLK. For example, the level of the input signal IN may be changed at an edge of the clock signal CLK. The semiconductor apparatus 100 may receive the input signal IN using a first supply voltage V1, and delay the input signal IN through a first delay path. The semiconductor apparatus 100 may receive the clock signal CLK using a second supply voltage V2, and delay the clock signal CLK through a second delay path. The semiconductor apparatus 100 may generate the output signal OUT by sampling the input signal IN delayed through the first delay path in synchronization with the clock signal CLK delayed through the second delay path.

The semiconductor apparatus 100 may include a first receiver 111, a second receiver 112, a first delay line 121, and a second delay line 122. The first receiver 111 may receive the input signal IN. The first receiver 111 may further receive a reference voltage VREF. The first receiver 111 may generate an amplified input signal AIN by differentially amplifying the input signal IN and the reference voltage VREF. The reference voltage VREF may have a voltage level corresponding to the middle of the range in which the input signal IN swings. The first receiver 111 may receive the input signal IN using the first supply voltage V1. The first receiver 111 may receive the first supply voltage V1 and a ground voltage, and amplify the input signal IN and the reference voltage VREF. The first receiver 111 may be coupled to a first power supply line 101, and receive the first supply voltage V1 through the first power supply line 101. The first power supply line 101 may be a power supply mesh for supplying the first supply voltage V1.

The second receiver 112 may receive the clock signal CLK. The second receiver 112 may further receive a complementary clock signal CLKB. The complementary clock signal CLKB may have the opposite voltage level to the clock signal CLK. The second receiver 112 may receive the clock signal CLK and the complementary clock signal CLKB, which are transmitted as differential signals. The second receiver 112 may generate an amplified clock signal ACLK by differentially amplifying the clock signal CLK and the complementary clock signal CLKB. The second receiver 112 may receive the clock signal CLK using the second supply voltage V2. The second receiver 112 may receive the second supply voltage V2 and the ground voltage, and amplify the clock signal CLK and the complementary clock signal CLKB. The second receiver 112 may be coupled to a second power supply line 102, and receive the second supply voltage V2 through the second power supply line 102. The second power supply line 102 may be a power supply mesh for supplying the second supply voltage V2. The second power supply line 102 may be a power supply mesh separated from the first power supply line 101.

The first delay line 121 may be coupled to the first receiver 111, and receive an output of the first receiver 111. The first delay line 121 may be the first delay path for delaying the input signal IN. The first delay line 121 may generate a received input signal RIN by delaying the output of the first receiver 111. The first delay line 121 may generate the received input signal RIN by variably delaying the amplified input signal AIN. The first delay line 121 may be coupled to the first power supply line 101, and be operated by the first supply voltage V1 received from the first power supply line 101. The second delay line 122 may be coupled to the second receiver 112, and receive an output of the second receiver 112. The second delay line 122 may be the second delay path for delaying the clock signal CLK. The second delay line 122 may generate a received clock signal RCLK by delaying the output of the second receiver 112. The second delay line 122 may generate the received clock signal RCLK by variably delaying the amplified clock signal ACLK. The second delay line 122 may be coupled to the first power supply line 101, and be operated by the first supply voltage V1 received from the first power supply line 101.

The first and second supply voltages V1 and V2 may be internal voltages generated from an external supply voltage. The first and second supply voltages V1 and V2 may be generated to have substantially the same voltage level. Because the first and second supply voltages V1 and V2 are supplied through different power supply lines, it may be difficult for the first and second supply voltages V1 and V2 to retain the same voltage level depending on the operation environment of the semiconductor apparatus 100. When the first and second supply voltages V1 and V2 do not retain the same level, a timing skew may occur between the received input signal RIN and the received clock signal RCLK. Therefore, although the input signal IN and the clock signal CLK are inputted to the first and second receivers 111 and 112 at a synchronized timing, the amplified input signal AIN and the amplified clock signal ACLK may be generated at different time points. Thus, a phase difference may occur between the received input signal RIN and the received clock signal RCLK. The larger a relative voltage level difference between the first and second supply voltages V1 and V2, the larger the timing skew and/or phase difference. When the phase difference between the received input signal RIN and the received clock signal RCLK increases, the semiconductor apparatus 100 may reduce a setup and hold time for sampling the received input signal RIN in synchronization with the received clock signal RCLK. Therefore, the semiconductor apparatus 100 may compensate for the timing skew and/or phase difference by varying delay amounts of the first and second delay lines 121 and 122.

The semiconductor apparatus 100 may change the delay amount of the first delay line 121 complementarily with the delay amount of the second delay line 122, based on the first supply voltage V1 and the second supply voltage V2. The delay amount of the first delay line 121 may be changed based on the voltage level of the first supply voltage V1 with respect to the second supply voltage V2. The delay amount of the first delay line 121 may be changed depending on whether the first supply voltage V1 has a higher or lower voltage level than the second supply voltage V2. The delay amount of the second delay line 122 may be changed based on the voltage level of the second supply voltage V2 with respect to the first supply voltage V1. The delay amount of the second delay line 122 may be changed depending on whether the second supply voltage V2 has a higher or lower voltage level than the first supply voltage V1.

The first delay line 121 may receive a first delay control signal DL1, and the delay amount of the first delay line 121 may be changed based on the first delay control signal DL1. The first delay control signal DL1 may be generated based on the voltage level of the first supply voltage V1 with respect to the second supply voltage V2. The first delay line 121 may further receive a first complementary delay control signal DL1B, and the delay amount of the first delay line 121 may be changed based on the first complementary delay control signal DL1B with the first delay control signal DL1. The first complementary delay control signal DL1B may be generated based on the voltage level of the second supply voltage V2 with respect to the first supply voltage V1. The delay amount of the first delay line 121 may be increased based on the first delay control signal DL1, and decreased based on the first complementary delay control signal DL1B. However, the method and/or operation of changing the delay amount of the first delay line 121 according to the first delay control signal DL1 and the first complementary delay control signal DL1B is not limited thereto.

The second delay line 122 may receive a second delay control signal DL2, and the delay amount of the second delay line 122 may be changed based on the second delay control signal DL2. The second delay control signal DL2 may be generated based on the voltage level of the second supply voltage V2 with respect to the first supply voltage V1. The second delay line 122 may further receive a second complementary delay control signal DL2B, and the delay amount of the second delay line 122 may be changed based on the second complementary delay control signal DL2B with the second delay control signal DL2. The second complementary delay control signal DL2B may be generated based on the voltage level of the first supply voltage V1 with respect to the second supply voltage V2. The delay amount of the second delay line 122 may be increased based on the second delay control signal DL2, and decreased based on the second complementary delay control signal DL2B. However, the method and/or operation of changing the delay amount of the second delay line 122 according to the second delay control signal DL2 and the second complementary delay control signal DL2B is not limited thereto.

The first delay control signal DL1, the first complementary delay control signal DL1B, the second delay control signal DL2, and the second complementary delay control signal DL2B may be analog voltage signals. The first and second delay lines 121 and 122 may be voltage controlled delay lines, and the delay amounts of the first and second delay lines 121 and 122 may be changed based on the first delay control signal DL1, the first complementary delay control signal DL1B, the second delay control signal DL2, and the second complementary delay control signal DL2B, which are analog voltage signals. In an embodiment, the first and second delay lines 121 and 122 may be digitally controlled delay lines. The first and second delay lines 121 and 122 may additionally include an analog-to-digital converter configured to convert the first delay control signal DL1, the first complementary delay control signal DL1B, the second delay control signal DL2, and the second complementary delay control signal DL2B, which are analog voltage signals, into digital signals. The delay amounts of the first and second delay lines 121 and 122 may be changed based on the digital signals.

The semiconductor apparatus 100 may further include a latch circuit 130. The latch circuit 130 may be coupled to the first delay line 121, and receive the received input signal RIN outputted from the first delay line 121. The latch circuit 130 may be coupled to the second delay line 122, and receive the received clock signal RCLK outputted from the second delay line 122. The latch circuit 130 may sample the received input signal RIN in synchronization with the received clock signal RCLK. The latch circuit 130 may output the received input signal RIN as the output signal OUT in synchronization with the received clock signal RCLK. The latch circuit 130 may receive the received input signal RIN through an input terminal thereof, receive the received clock signal RCLK through a clock terminal thereof, and output the output signal OUT through an output terminal thereof. The latch circuit 130 may be coupled to the first power supply line 101, and be operated by the first supply voltage V1 received through the first power supply line 101.

The semiconductor apparatus 100 may further include a first voltage detection circuit 141 and a second voltage detection circuit 142. The first voltage detection circuit 141 may generate the first delay control signal DL1 and the first complementary delay control signal DL1B based on the first supply voltage V1 and the second supply voltage V2. The first voltage detection circuit 141 may receive the first supply voltage V1 as a positive input signal, and receive the second supply voltage V2 as a negative input signal. The first voltage detection circuit 141 may generate the first delay control signal DL1 and the first complementary delay control signal DL1B by comparing the voltage levels of the first supply voltage V1 and the second supply voltage V2. The second voltage detection circuit 142 may generate the second delay control signal DL2 and the second complementary delay control signal DL2B based on the first supply voltage V1 and the second supply voltage V2. The second voltage detection circuit 142 may receive the second supply voltage V2 as a positive input signal, and receive the first supply voltage V1 as a negative input signal. The second voltage detection circuit 142 may generate the second delay control signal DL2 and the second complementary delay control signal DL2B by comparing the voltage levels of the second supply voltage V2 and the first supply voltage V1. The first and second voltage detection circuits 141 and 142 may have the same circuit structure, and complementarily receive the first and second supply voltages V1 and V2. Therefore, the first delay control signal DL1 may have a complementary relation with the second delay control signal DL2, and the first complementary delay control signal DL1B may have a complementary relation with the second complementary delay control signal DL2B.

Figure 2:
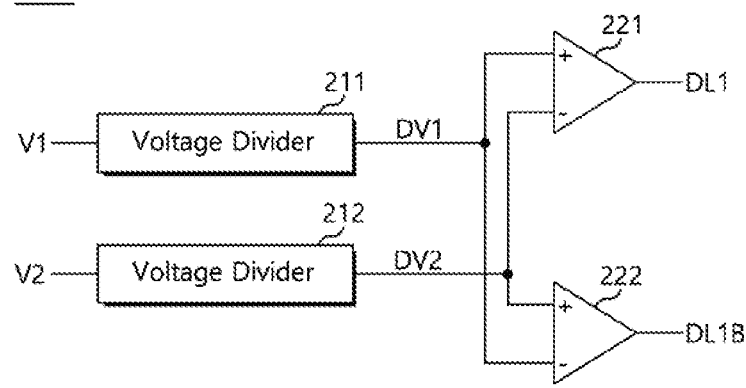
FIG. 2 is a diagram illustrating a configuration of a first voltage detection circuit illustrated in FIG. 1.

FIG. 2 is a diagram illustrating the configuration of the first voltage detection circuit 141 illustrated in FIG. 1. Referring to FIG. 2, the first voltage detection circuit 141 may include a voltage divider 211, a voltage divider 212, a first comparator 221, and a second comparator 222. The voltage divider 211 may receive the first supply voltage V1, and generate a first divided voltage DV1 by dividing the first supply voltage V1. For example, the first divided voltage DV1 may have a voltage level corresponding to a half of the first supply voltage V1. The voltage divider 212 may receive the second supply voltage V2, and generate a second divided voltage DV2 by dividing the second supply voltage V2. For example, the second divided voltage DV2 may have a voltage level corresponding to a half of the second supply voltage V2.

The first comparator 221 may receive the first divided voltage DV1 through a positive input terminal (+) thereof, and receive the second divided voltage DV2 through a negative input terminal (−) thereof. The first comparator 221 may generate the first delay control signal DL1 by comparing the voltage levels of the first and second divided voltages DV1 and DV2. The second comparator 222 may receive the second divided voltage DV2 through a positive input terminal (+) thereof, and receive the first divided voltage DV1 through a negative input terminal (−) thereof. The second comparator 222 may generate the first complementary delay control signal DL1B by comparing the voltage levels of the first and second divided voltages DV1 and DV2.

Figure 3:
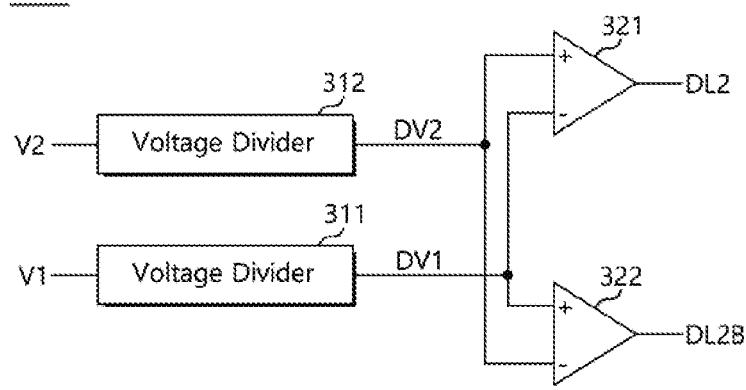
FIG. 3 is a diagram illustrating a configuration of a second voltage detection circuit illustrated in FIG. 1.

FIG. 3 is a diagram illustrating the configuration of the second voltage detection circuit 142 illustrated in FIG. 1. Referring to FIG. 2, the second voltage detection circuit 142 may include a voltage divider 311, a voltage divider 312, a third comparator 321, and a fourth comparator 322. The voltage divider 311 may receive the first supply voltage V1, and generate a first divided voltage DV1 by dividing the first supply voltage V1. The voltage divider 312 may receive the second supply voltage V2, and generate a second divided voltage DV2 by dividing the second supply voltage V2. In an embodiment, the voltage divider may be installed only in any one of the first and second voltage detection circuits 141 and 142, and the first to fourth comparators 221, 222, 321, and 322 may be modified to receive the first and second divided voltages DV1 and DV2 in common. In an embodiment, the voltage divider may be disposed outside the first and second voltage detection circuits 141 and 142, the first voltage detection circuit 141 may be composed of only the first and second comparators 221 and 222, and the second voltage detection circuit 142 may be composed of only the third and fourth comparators 321 and 322.

The third comparator 321 may receive the second divided voltage DV2 through a positive input terminal (+) thereof, and receive the first divided voltage DV1 through a negative input terminal (−) thereof. The third comparator 321 may generate the second delay control signal DL2 by comparing the voltage levels of the first and second divided voltages DV1 and DV2. Because the third comparator 321 receives the first and second divided voltages DV1 and DV2 in the opposite way of the first comparator 221, the second delay control signal DL2 may have a complementary relation with the first delay control signal DL1. The fourth comparator 322 may receive the first divided voltage DV1 through a positive input terminal (+) thereof, and receive the second divided voltage DV2 through a negative input terminal (−) thereof. The fourth comparator 322 may generate the second complementary delay control signal DL2B by comparing the voltage levels of the first and second divided voltages DV1 and DV2. Because the fourth comparator 322 receives the first and second divided voltages DV1 and DV2 in the opposite way of the second comparator 222, the second complementary delay control signal DL2B may have a complementary relation with the first complementary delay control signal DL1B.

Figure 4:
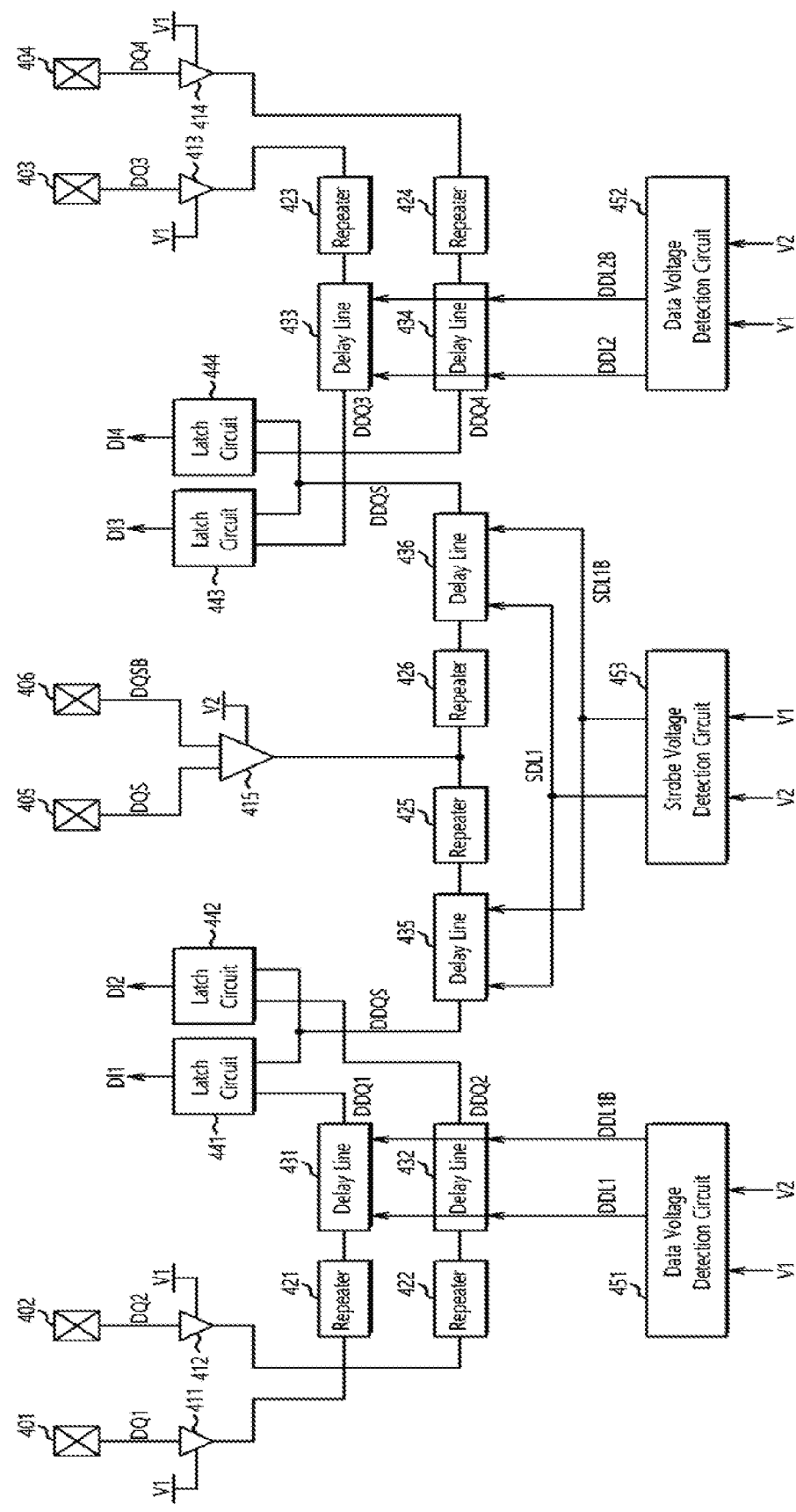
FIG. 4 is a diagram illustrating a configuration of a semiconductor apparatus in accordance with an embodiment.

FIG. 4 is a diagram illustrating a configuration of a semiconductor apparatus 400 in accordance with an embodiment. Referring to FIG. 4, the semiconductor apparatus 400 may receive a data signal and a data strobe signal from an external device and generate an internal data signal. The semiconductor apparatus 400 may include a first data pad 401, a second data pad 402, a third data pad 403, a fourth data pad 404, a first strobe pad 405, and a second strobe pad 406. The first data pad 401 may be coupled to a data transmission line through which a first data signal DQ1 is transmitted from the external device, and the semiconductor apparatus 400 may receive the first data signal DQ1 through the first data pad 401. The second data pad 402 may be coupled to a data transmission line through which a second data signal DQ2 is transmitted from the external device, and the semiconductor apparatus 400 may receive the second data signal DQ2 through the second data pad 402. The third data pad 403 may be coupled to a data transmission line through which a third data signal DQ3 is transmitted from the external device, and the semiconductor apparatus 400 may receive the third data signal DQ3 through the third data pad 403. The fourth data pad 404 may be coupled to a data transmission line through which a fourth data signal DQ4 is transmitted from the external device, and the semiconductor apparatus 400 may receive the fourth data signal DQ4 through the fourth data pad 404. FIG. 4 illustrates that the semiconductor apparatus 400 receives four data signals through four data pads, but the present embodiment is not limited thereto. The number of data pads included in the semiconductor apparatus 400 and the number of data signals received through the data pads may be set to 8, 16, 32, or more. The first strobe pad 405 may be coupled to a data strobe transmission line through which a data strobe signal DQS is transmitted from the external device, and the semiconductor apparatus 400 may receive the data strobe signal DQS through the first strobe pad 405. The second strobe pad 406 may be coupled to a data strobe transmission line through which a complementary data strobe signal DQSB is transmitted from the external device, and the semiconductor apparatus 400 may receive the complementary data strobe signal DQSB through the second strobe pad 406.

The semiconductor apparatus 400 may include a first data receiver 411, a second data receiver 412, a third data receiver 413, a fourth data receiver 414, and a strobe receiver 415. The first data receiver 411 may be coupled to the first data pad 401, and receive the first data signal DQ1 through the first data pad 401. The first data receiver 411 may use a reference voltage VREF to receive the first data signal DQ1. The reference voltage VREF may have a voltage level corresponding to the middle of the range in which the first to fourth data signals DQ1 to DQ4 swing. The second data receiver 412 may be coupled to the second data pad 402, and receive the second data signal DQ2 through the second data pad 402. The second data receiver 412 may use the reference voltage VREF to receive the second data signal DQ2. The third data receiver 413 may be coupled to the third data pad 403, and receive the third data signal DQ3 through the third data pad 403. The third data receiver 413 may use the reference voltage VREF to receive the third data signal DQ3. The fourth data receiver 414 may be coupled to the fourth data pad 404, and receive the fourth data signal DQ4 through the fourth data pad 404. The fourth data receiver 414 may use the reference voltage VREF to receive the fourth data signal DQ4. The first receiver 111 illustrated in FIG. 1 may be applied as each of the first to fourth data receivers 411 to 414. The first to fourth data receivers 411 to 414 may be operated by the first supply voltage V1 supplied thereto. The strobe receiver 415 may be coupled to the first and second strobe pads 405 and 406, and receive the data strobe signal DQS and the complementary data strobe signal DQSB. The strobe receiver 415 may receive the data strobe signal DQS by differentially amplifying the data strobe signal DQS and the complementary data strobe signal DQSB. The second receiver 112 illustrated in FIG. 1 may be applied as the strobe receiver 415. The strobe receiver 415 may be operated by the second supply voltage V2 supplied thereto.

The semiconductor apparatus 400 may include a first repeater 421, a second repeater 422, a third repeater 423, a fourth repeater 424, a fifth repeater 425, a sixth repeater 426, a first delay line 431, a second delay line 432, a third delay line 433, a fourth delay line 434, a fifth delay line 435, and a sixth delay line 436. The first to fourth delay lines 431 to 434 may serve as data delay lines, and the fifth and sixth delay lines 435 and 436 may serve as strobe delay lines. The first repeater 421 and the first delay line 431 may serve as a delay path of the first data signal DQ1. The first repeater 421 may drive the first data signal DQ1 received through the first data receiver 411, and the first delay line 431 may generate a first delayed data signal DDQ1 by delaying the first data signal DQ1. The second repeater 422 and the second delay line 432 may serve as a delay path of the second data signal DQ2. The second repeater 422 may drive the second data signal DQ2 received through the second data receiver 412, and the second delay line 432 may generate a second delayed data signal DDQ2 by delaying the second data signal DQ2. The third repeater 423 and the third delay line 433 may serve as a delay path of the third data signal DQ3. The third repeater 423 may drive the third data signal DQ3 received through the third data receiver 413, and the third delay line 433 may generate a third delayed data signal DDQ3 by delaying the third data signal DQ3. The fourth repeater 424 and the fourth delay line 434 may serve as a delay path of the fourth data signal DQ4. The fourth repeater 424 may drive the fourth data signal DQ4 received through the fourth data receiver 414, and the fourth delay line 434 may generate a fourth delayed data signal DDQ4 by delaying the fourth data signal DQ4. The fifth repeater 425, the sixth repeater 426, the fifth delay line 435, and the sixth delay line 436 may serve as a delay path of the data strobe signal DQS. Each of the fifth and sixth repeaters 425 and 426 may drive the data strobe signal DQS, and each of the fifth and sixth delay lines 435 and 436 may generate a delayed data strobe signal DDQS by delaying the data strobe signal DQS.

The semiconductor apparatus 400 may include a first latch circuit 441, a second latch circuit 442, a third latch circuit 443, and a fourth latch circuit 444. The first latch circuit 441 may be coupled to the first delay line 431 and the fifth delay line 435, receive the first delayed data signal DDQ1 from the first delay line 431, and receive the delayed data strobe signal DDQS from the fifth delay line 435. The first latch circuit 441 may sample the first delayed data signal DDQ1 in synchronization with the delayed data strobe signal DDQS, and output the sampled signal as a first internal data signal DI1. The second latch circuit 442 may be coupled to the second delay line 432 and the fifth delay line 435, receive the second delayed data signal DDQ2 from the second delay line 432, and receive the delayed data strobe signal DDQS from the fifth delay line 435. The second latch circuit 442 may sample the second delayed data signal DDQ2 in synchronization with the delayed data strobe signal DDQS, and output the sampled signal as a second internal data signal DI2. The third latch circuit 443 may be coupled to the third delay line 433 and the sixth delay line 436, receive the third delayed data signal DDQ3 from the third delay line 433, and receive the delayed data strobe signal DDQS from the sixth delay line 436. The third latch circuit 443 may sample the third delayed data signal DDQ3 in synchronization with the delayed data strobe signal DDQS, and output the sampled signal as a third internal data signal DI3. The fourth latch circuit 444 may be coupled to the fourth delay line 434 and the sixth delay line 436, receive the fourth delayed data signal DDQ4 from the fourth delay line 434, and receive the delayed data strobe signal DDQS from the sixth delay line 436. The fourth latch circuit 444 may sample the fourth delayed data signal DDQ4 in synchronization with the delayed data strobe signal DDQS, and output the sampled signal as a fourth internal data signal DI4. The latch circuit 130 illustrated in FIG. 1 may be applied as each of the first to fourth latch circuits 441 to 444.

The semiconductor apparatus 400 may include a first data voltage detection circuit 451, a second data voltage detection circuit 452, and a strobe voltage detection circuit 453. The first data voltage detection circuit 451 may receive the first and second supply voltages V1 and V2, and generate a first data delay control signal DDL1 and a first complementary data delay control signal DDL1B. The first data voltage detection circuit 451 may receive the first supply voltage V1 as a positive input signal, and receive the second supply voltage V2 as a negative input signal. The first data voltage detection circuit 451 may generate the first data delay control signal DDL1 based on the voltage level of the first supply voltage V1 with respect to the second supply voltage V2, and generate the first complementary data delay control signal DDL1B based on the voltage level of the second supply voltage V2 with respect to the first supply voltage V1. The first voltage detection circuit 141 illustrated in FIGS. 1 and 2 may be applied as the first data voltage detection circuit 451. The delay amounts of the first and second delay lines 431 and 432 may be changed based on the first data delay control signal DDL1 and the first complementary data delay control signal DDL1B.

The second data voltage detection circuit 452 may receive the first and second supply voltages V1 and V2, and generate a second data delay control signal DDL2 and a second complementary data delay control signal DDL2B. The second data voltage detection circuit 452 may receive the first supply voltage V1 as a positive input signal, and receive the second supply voltage V2 as a negative input signal. The second data voltage detection circuit 452 may generate the second data delay control signal DDL2 based on the voltage level of the first supply voltage V1 with respect to the second supply voltage V2, and generate the second complementary data delay control signal DDL2B based on the voltage level of the second supply voltage V2 with respect to the first supply voltage V1. The first voltage detection circuit 141 illustrated in FIGS. 1 and 2 may be applied as the second data voltage detection circuit 452. The delay amounts of the third and fourth delay lines 433 and 434 may be changed based on the second data delay control signal DDL2 and the second complementary data delay control signal DDL2B.

The strobe voltage detection circuit 453 may receive the first and second supply voltages V1 and V2, and generate a strobe delay control signal SDL1 and a complementary strobe delay control signal SDL1B. The strobe voltage detection circuit 453 may receive the second supply voltage V2 as a positive input signal, and receive the first supply voltage V1 as a negative input signal. The strobe voltage detection circuit 453 may generate the strobe delay control signal SDL1 based on the voltage level of the second supply voltage V2 with respect to the first supply voltage V1, and generate the complementary strobe delay control signal SDL1B based on the voltage level of the first supply voltage V1 with respect to the second supply voltage V2. The second voltage detection circuit 142 illustrated in FIGS. 1 and 3 may be applied as the strobe voltage detection circuit 453. The delay amounts of the fifth and sixth delay lines may be changed based on the strobe delay control signal SDL1 and the complementary strobe delay control signal SDL1B.

The first data voltage detection circuit 451 may be disposed on the left side of the strobe voltage detection circuit 453, and the second data voltage detection circuit 452 may be disposed on the right side of the strobe voltage detection circuit 453. The first data voltage detection circuit 451 may be disposed adjacent to an area in which the first data pad 401, the second data pad 402, the first delay line 431, and the second delay line 432 are disposed. The strobe voltage detection circuit 453 may be disposed adjacent to the area in which the first strobe pad 405, the second strobe pad 406, the fifth delay line 435 and the sixth delay line 436 are disposed. The second data voltage detection circuit 452 may be disposed adjacent to the area in which the third data pad 403, the fourth data pad 404, the third delay line 433, and the fourth delay line 434 are disposed. The first supply voltage V1 may be supplied to the first data voltage detection circuit 451, the second data voltage detection circuit 452 and the strobe voltage detection circuit 453 in common through the first power supply line, and the second supply voltage V2 may be supplied to the first data voltage detection circuit 451, the second data voltage detection circuit 452, and the strobe voltage detection circuit 453 in common through the second power supply line separated from the first power supply line. However, different IR drops and/or Ohmic drops may occur depending on the areas in which the voltage detection circuits are disposed, and level variations in the first and second supply voltages V1 and V2 received by the voltage detection circuits may be changed. The semiconductor apparatus 400 may include the plurality of voltage detection circuits adjacent to the areas where the data signal and the data strobe signal are received, respectively, and generate different delay control signals through the plurality of voltage detection circuits, thereby setting the optimum delay amount for each of the delay lines regardless of PVT (Process, Voltage, and Temperature) variations.

Figure 5:
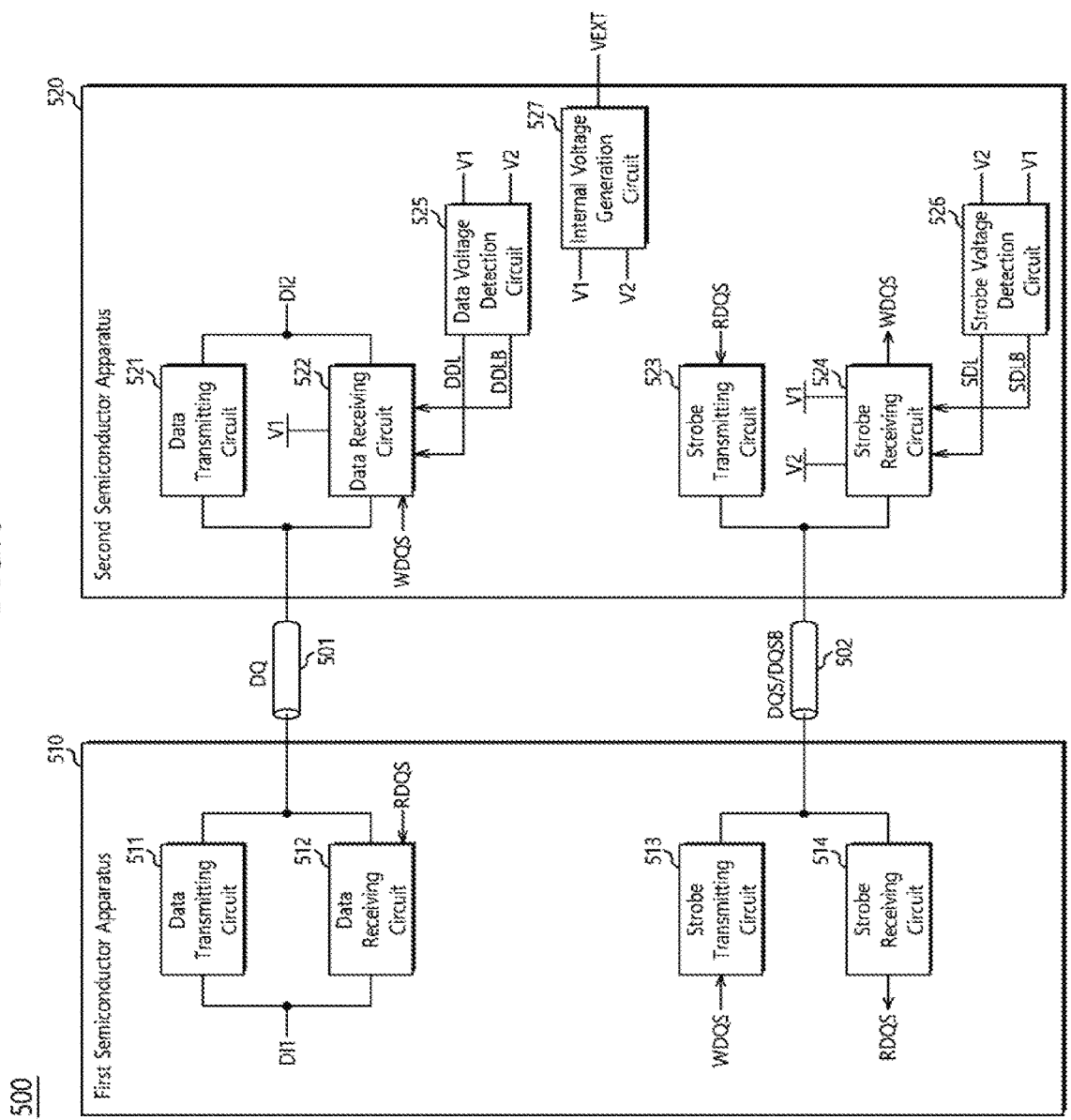
FIG. 5 is a diagram illustrating a configuration of a semiconductor system in accordance with an embodiment.

FIG. 5 is a diagram illustrating a configuration of a semiconductor system 500 in accordance with an embodiment. Referring to FIG. 5, the semiconductor system 500 may include a first semiconductor apparatus 510 and a second semiconductor apparatus 520. The first semiconductor apparatus 510 may provide various control signals used in operating the second semiconductor apparatus 520. The first semiconductor apparatus 510 may include various types of host devices. For example, the first semiconductor apparatus 510 may include a CPU (Central Processing Unit), a GPU (Graphics Processing Unit), an MMP (Multi-Media Processor), a digital signal processor, an AP (Application Processor) and a memory controller. The second semiconductor apparatus 520 may be a memory apparatus, for example. The memory apparatus may include a volatile memory and a nonvolatile memory. The volatile memory may include an SRAM (Static RAM), DRAM (Dynamic RAM) and SDRAM (Synchronous DRAM), and the nonvolatile memory may include a ROM (Read Only Memory), PROM (Programmable ROM), EEPROM (Electrically Erasable and Programmable ROM), EPROM (Electrically Programmable ROM), flash memory, PRAM (Phase change RAM), MRAM (Magnetic RAM), RRAM (Resistive RAM), and FRAM (Ferroelectric RAM).

The second semiconductor apparatus 520 may be coupled to the first semiconductor apparatus 510 through a plurality of buses. The plurality of buses may be signal transmission paths, links, or channels for transmitting signals. The plurality of buses may include a data bus 501 and a data strobe bus 502. The data bus 501 and the data strobe bus 502 may be two-way buses. The data bus 501 may include a plurality of data transmission lines, and the data strobe bus 502 may include a plurality of data strobe transmission lines. The first and second semiconductor apparatuses 510 and 520 may perform a write operation and a read operation through the data bus 501 and the data strobe bus 502. The write operation may indicate an operation of transmitting data from the first semiconductor apparatus 510 to the second semiconductor apparatus 520, and the read operation may indicate an operation of transmitting data from the second semiconductor apparatus 520 to the first semiconductor apparatus 510. During the write operation, the first semiconductor apparatus 510 may transmit data DQ to the second semiconductor apparatus 520 through the data bus 501. The first semiconductor apparatus 510 may transmit a data strobe signal DQS and a complementary data strobe signal DQSB to the second semiconductor apparatus 520 through the data strobe bus 502. During the read operation, the second semiconductor apparatus 520 may output the data DQ to the first semiconductor apparatus 510 through the data bus 501. The second semiconductor apparatus 520 may transmit the data strobe signal DQS and the complementary data strobe signal DQSB to the first semiconductor apparatus 510 through the data strobe bus 502. Although not illustrated, the second semiconductor apparatus 520 may be coupled to the first semiconductor apparatus 510 through a command bus, an address bus, a clock bus, and the like. The command bus, the address bus, and the clock bus may be one-way buses. The first semiconductor apparatus 510 may provide a command signal to the second semiconductor apparatus 520 through the command bus. The first semiconductor apparatus 510 may provide an address signal to the second semiconductor apparatus 520 through the address bus. The first semiconductor apparatus 510 may provide a system clock signal to the second semiconductor apparatus 520 through the clock bus.

The first semiconductor apparatus 510 may include a data transmitting circuit 511, a data receiving circuit 512, a strobe transmitting circuit 513, and a strobe receiving circuit 514. The data transmitting circuit 511 may be coupled to the data bus 501, and drive the data bus 501 based on internal data DIN1 of the first semiconductor apparatus 510 and transmit the data DQ through the data bus 501. The data receiving circuit 512 may be coupled to the data bus 501, and receive the data DQ transmitted from the second semiconductor apparatus 520 through the data bus 501. The data receiving circuit 512 may generate the internal data DIN1 of the first semiconductor apparatus 510 based on the data DQ. The strobe transmitting circuit 513 may be coupled to the data strobe bus 502, and drive the data strobe bus 502 based on a write data strobe signal WDQS and transmit the data strobe signal DQS and the complementary data strobe signal DQSB to the second semiconductor apparatus 520 through the data strobe bus 502. The strobe receiving circuit 514 may be coupled to the data strobe bus 502, and receive the data strobe signal DQS and the complementary data strobe signal DQSB, transmitted from the second semiconductor apparatus 520, through the data strobe bus 502. The strobe receiving circuit 514 may generate a read data strobe signal RDQS based on the data strobe signal DQS and the complementary data strobe signal DQSB. The timing of the data DQ outputted from the data transmitting circuit 511 may be synchronized with the timing of the data strobe signal DQS outputted from the strobe transmitting circuit 513. The timings of the data DQ and the data strobe signal DQS, transmitted from the second semiconductor apparatus 520, may be synchronized with each other, and the data receiving circuit 512 may sample the data DQ received through the data bus 501, based on the read data strobe signal RDQS.

The second semiconductor apparatus 520 may include a data transmitting circuit 521, a data receiving circuit 522, a strobe transmitting circuit 523, and a strobe receiving circuit 524. The data transmitting circuit 521 may be coupled to the data bus 501, and drive the data bus 501 based on internal data DIN2 of the second semiconductor apparatus 520 and transmit the data DQ through the data bus 501. The data receiving circuit 522 may be coupled to the data bus 501, and receive the data DQ transmitted from the first semiconductor apparatus 510 through the data bus 501. The data receiving circuit 522 may generate the internal data DIN2 of the second semiconductor apparatus 520 based on the data DQ. The strobe transmitting circuit 523 may be coupled to the data strobe bus 502, and drive the data strobe bus 502 based on the read data strobe signal RDQS and transmit the data strobe signal DQS and the complementary data strobe signal DQSB to the first semiconductor apparatus 510 through the data strobe bus 502. The strobe receiving circuit 524 may be coupled to the data strobe bus 502, and receive the data strobe signal DQS and the complementary data strobe signal DQSB, transmitted from the first semiconductor apparatus 510, through the data strobe bus 502. The strobe receiving circuit 524 may generate the write data strobe signal WDQS based on the data strobe signal DQS and the complementary data strobe signal DQSB. The timing of the data DQ outputted from the data transmitting circuit 521 may be synchronized with the timing of the data strobe signal DQS outputted from the strobe transmitting circuit 523. The timings of the data DQ and the data strobe signal DQS, transmitted from the first semiconductor apparatus 510, may be synchronized with each other, and the data receiving circuit 522 may sample the data DQ received through the data bus 501, based on the write data strobe signal WDQS.

The data receiving circuit 522 may be operated by the first supply voltage V1 supplied thereto. The strobe receiving circuit 524 may be operated by the second supply voltage V2 and the first supply voltage V1 which are supplied thereto. Therefore, when a voltage level difference occurs between the first and second supply voltages V1 and V2, a timing skew and/or phase difference may occur between the write data strobe signal WDQS and the data received through the data receiving circuit 522. The data receiving circuit 522 may variably delay the received data based on the voltage levels of the first and second supply voltages V1 and V2. The data receiving circuit 522 may adjust the time by which the received data are delayed, based on a data delay control signal DDL and a complementary data delay control signal DDLB. The strobe receiving circuit 524 may generate the write data strobe signal WDQS by variably delaying the received data strobe signal based on the voltage levels of the first and second supply voltages V1 and V2. The strobe receiving circuit 524 may adjust the time by which the received data strobe signal DQS is delayed, based on a strobe delay control signal SDL and a complementary strobe delay control signal SDLB.

The second semiconductor apparatus 520 may further include a data voltage detection circuit 525 and a strobe voltage detection circuit 526. The data voltage detection circuit 525 may generate the data delay control signal DDL and the complementary data delay control signal DDLB by detecting the voltage levels of the first and second supply voltages V1 and V2. The strobe voltage detection circuit 526 may generate the strobe delay control signal SDL and the complementary strobe delay control signal SDLB by detecting the voltage levels of the first and second supply voltages V1 and V2. The data voltage detection circuit 525 and the strobe voltage detection circuit 526 may have the same circuit structure, but complementarily receive the first and second supply voltages V1 and V2 and generate the delay control signals having complementary characteristics. For example, the data voltage detection circuit 525 may receive the first supply voltage V1 as a positive input signal, and receive the second supply voltage V2 as a negative input signal. The strobe voltage detection circuit 526 may receive the second supply voltage V2 as a positive input signal, and receive the first supply voltage V1 as a negative input signal. Thus, the data delay control signal DDL and the strobe delay control signal SDL may have complementary characteristics with each other, and the complementary data delay control signal DDLB and the complementary strobe delay control signal SDLB may have complementary characteristics with each other. Therefore, although a voltage level difference occurs between the first and second supply voltages V1 and V2, the timing of the data received through the data receiving circuit 522 may be matched with the timing of the write data strobe signal WDQS, and the data receiving circuit 522 may secure a setup and hold time enough to sample the received data with the write data strobe signal WDQS.

The second semiconductor apparatus 520 may further include an internal voltage generation circuit 527. The internal voltage generation circuit 527 may receive an external supply voltage VEXT from an external power supply, and generate the first and second supply voltages V1 and V2 based on the external supply voltage VEXT. The first and second supply voltages V1 and V2 generated through the internal voltage generation circuit 527 may have substantially the same voltage level. In an embodiment, the data receiving circuit 512 and the strobe receiving circuit 514 of the first semiconductor apparatus 510 may be modified to operate in a similar manner to the data receiving circuit 522 and the strobe receiving circuit 524 of the second semiconductor apparatus 520. The first semiconductor apparatus 510 may further include components corresponding to the data voltage detection circuit 525 and the strobe voltage detection circuit 526.

While various embodiments have been described above, it will be understood by those skilled in the art that the embodiments described serve as examples only. Accordingly, the semiconductor apparatus and the semiconductor system which are described herein should not be limited based on the described embodiments.

What is claimed is:

1. A semiconductor apparatus comprising:
a first receiver configured to receive an input signal using a first supply voltage;
a first delay line configured to delay an output of the first receiver, based on a first delay control signal and a first complementary delay control signal, to generate a received signal;
a second receiver configured to receive a clock signal using a second supply voltage;
a second delay line configured to delay an output of the second receiver, based on a second delay control signal and a second complementary delay control signal, to generate a received clock signal;
a first voltage detection circuit configured to receive the first supply voltage as a positive input signal, to receive the second supply voltage as a negative input signal, and to compare the levels of the first and second supply voltages to generate the first delay control signal and the first complementary delay control signal; and
a second voltage detection circuit configured to receive the second supply voltage as a positive input signal, to receive the first supply voltage as a negative input signal, and to compare the levels of the first and second supply voltages to generate the second delay control signal and the second complementary delay control signal.

2. The semiconductor apparatus according to claim 1, wherein the first receiver is configured to differentially amplify the input signal and a reference voltage to generate an amplified signal, wherein the reference voltage has a voltage level corresponding to the middle of the range in which the input signal swings.

3. The semiconductor apparatus according to claim 2, wherein the first delay line is configured to variably delay the amplified signal to generate the received signal, wherein a delay amount of the first delay line is changed based on the first delay control signal and the first complementary delay control signal.

4. The semiconductor apparatus according to claim 1, wherein the second receiver is configured to differentially amplify the clock signal and a complementary clock signal to generate an amplified clock signal.

5. The semiconductor apparatus according to claim 4, wherein the second delay line is configured to variably delay the amplified clock signal to generate the received clock signal, wherein a delay amount of the second delay line is changed based on the second delay control signal and the second complementary delay control signal.

6. The semiconductor apparatus according to claim 1, wherein the first voltage detection circuit comprises:
a first voltage divider configured to divide the first supply voltage to generate a first divided voltage;
a second voltage divider configured to divide the second supply voltage to generate a second divided voltage;
a first comparator configured to receive the first divided voltage through a positive input terminal, to receive the second divided voltage through a negative input terminal, and to compare the voltage levels of the first and second divided voltages to generate the first delay control signal; and
a second comparator configured to receive the second divided voltage through a positive input terminal, to receive the first divided voltage through a negative input terminal, and to compare the voltage levels of the first and second divided voltages to generate the first complementary delay control signal.

7. The semiconductor apparatus according to claim 1, wherein the second voltage detection circuit comprises:
a first voltage divider configured to divide the first supply voltage to generate a first divided voltage;
a second voltage divider configured to divide the second supply voltage to generate a second divided voltage;
a third comparator configured to receive the second divided voltage through a positive input terminal, to receive the first divided voltage through a negative input terminal, and to compare the voltage levels of the first and second divided voltages to generate the second delay control signal; and
a fourth comparator configured to receive the first divided voltage through a positive input terminal, to receive the second divided voltage through a negative input terminal, and to compare the voltage levels of the first and second divided voltages to generate the second complementary delay control signal.

8. The semiconductor apparatus according to claim 1, further comprising a latch circuit configured to synchronize the received signal with the received clock signal to generate an output signal.

9. The semiconductor apparatus according to claim 1, further comprising an internal voltage generation circuit configured to receive an external supply voltage and generate the first and second supply voltages.

10. The semiconductor apparatus according to claim 9, wherein:
the internal voltage generation circuit is configured to generate the first and second supply voltages to have substantially the same voltage level,
the first receiver is configured to receive the first supply voltage through a first power supply line, and
the second receiver is configured to receive the second supply voltage through a second power supply line.

11. A semiconductor apparatus comprising:
a data receiver configured to receive a first supply voltage from a first power supply line and receive a data signal;
a first delay line configured to variably delay the received data signal to generate a delayed data signal;
a strobe receiver configured to receive a second supply voltage from a second power supply line and receive a data strobe signal; and
a second delay line configured to variably delay the received data strobe signal to generate a delayed data strobe signal,
wherein a delay amount of the first delay line is changed complementarily with a delay amount of the second delay line, based on the first and second supply voltages.

12. The semiconductor apparatus according to claim 11, wherein the data receiver is configured to differentially amplify the data and a reference voltage, wherein the reference voltage has a voltage level corresponding to the middle of the range in which the data swings.

13. The semiconductor apparatus according to claim 11, wherein the strobe receiver is configured to differentially amplify the data strobe signal and a complementary data strobe signal.

14. The semiconductor apparatus according to claim 11, wherein a delay amount of the first delay line is changed based on a data delay control signal and a complementary data delay control signal,
wherein the data delay control signal is generated based on the voltage level of the first supply voltage with respect to the voltage level of the second supply voltage and the complementary data delay control signal is generated based on the voltage level of the second supply voltage with respect to the voltage level of the first supply voltage.

15. The semiconductor apparatus according to claim 11, wherein a delay amount of the second delay line is changed based on a strobe delay control signal and a complementary strobe delay control signal,
wherein the strobe delay control signal is generated based on the voltage level of the second supply voltage with respect to the voltage level of the first supply voltage and the complementary strobe delay control signal is generated based on the voltage level of the first supply voltage with respect to the voltage level of the second supply voltage.

16. The semiconductor apparatus according to claim 11, further comprising:
a first voltage detection circuit configured to receive the first supply voltage as a positive input signal, to receive the second supply voltage as a negative supply voltage, and to detect the voltage levels of the first and second supply voltages and change the delay amount of the first delay line; and
a second voltage detection circuit configured to receive the second supply voltage as a positive input signal, to receive the first supply voltage as a negative supply voltage, and to detect the voltage levels of the first and second supply voltages and change the delay amount of the second delay line.

17. The semiconductor apparatus according to claim 16, wherein the first voltage detection circuit comprises:
a first voltage divider configured to divide the first supply voltage to generate a first divided voltage;
a second voltage divider configured to divide the second supply voltage to generate a second divided voltage;
a first comparator configured to receive the first divided voltage through a positive input terminal, to receive the second divided voltage through a negative input terminal, and to compare the voltage levels of the first and second divided voltages to generate the data delay control signal; and
a second comparator configured to receive the second divided voltage through a positive input terminal, to receive the first divided voltage through a negative input terminal, and to compare the voltage levels of the first and second divided voltages to generate the complementary data delay control signal.

18. The semiconductor apparatus according to claim 16, wherein the second voltage detection circuit comprises:
a first voltage divider configured to divide the first supply voltage to generate a first divided voltage;
a second voltage divider configured to divide the second supply voltage to generate a second divided voltage;
a third comparator configured to receive the second divided voltage through a positive input terminal, to receive the first divided voltage through a negative input terminal, and to compare the voltage levels of the first and second divided voltages to generate the strobe delay control signal; and
a fourth comparator configured to receive the first divided voltage through a positive input terminal, to receive the second divided voltage through a negative input terminal, and to compare the voltage levels of the first and second divided voltages to generate the complementary strobe delay control signal.

* * * * *